United States Patent [19]

Jalovec

[11] Patent Number: 4,540,982

[45] Date of Patent: Sep. 10, 1985

[54] DELAY COMPENSATION METHOD AND APPARATUS FOR DIGITAL DISPLAY SYSTEMS

[75] Inventor: Lee J. Jalovec, Beaverton, Oreg.

[73] Assignee: Tektronix, Inc., Beaverton, Oreg.

[21] Appl. No.: 378,665

[22] Filed: May 17, 1982

[51] Int. Cl.³ .............................................. G09G 1/00
[52] U.S. Cl. .................................... 340/743; 340/814;
324/121 R; 328/55; 328/155
[58] Field of Search ...................... 324/121 R, 121 E;
328/55, 155; 340/739, 743, 814

[56] References Cited

U.S. PATENT DOCUMENTS

| 3,045,851 | 7/1962 | Palmiter ............................. 340/739 |
| 3,540,032 | 10/1970 | Criscimagna et al. .............. 340/739 |
| 4,225,940 | 9/1980 | Moriyasu et al. ................ 324/121 R |
| 4,350,953 | 9/1982 | Best et al. ....................... 324/121 R |

Primary Examiner—Marshall M. Curtis
Attorney, Agent, or Firm—George T. Noe

[57] ABSTRACT

A delay compensation method and apparatus for digital display systems includes a differential clock generator which controls the timing of progenitor digital signals in separate signal-processing channels so that reconstructed horizontal and vertical analog signals arrive at a display device in a precise time match. Thus, timing errors may be adjusted out while the signals are still in digital form to provide an undistorted display.

10 Claims, 3 Drawing Figures

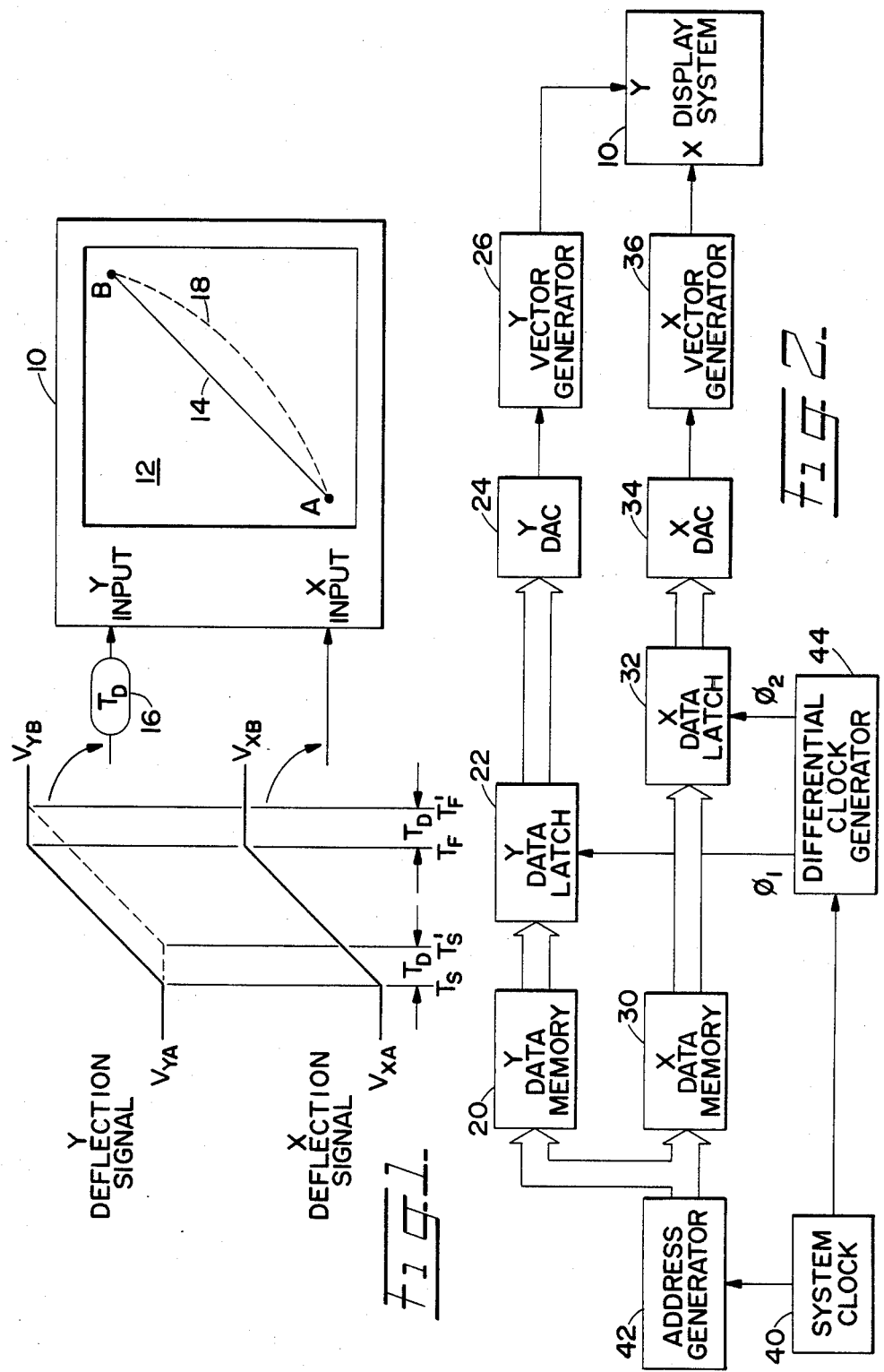

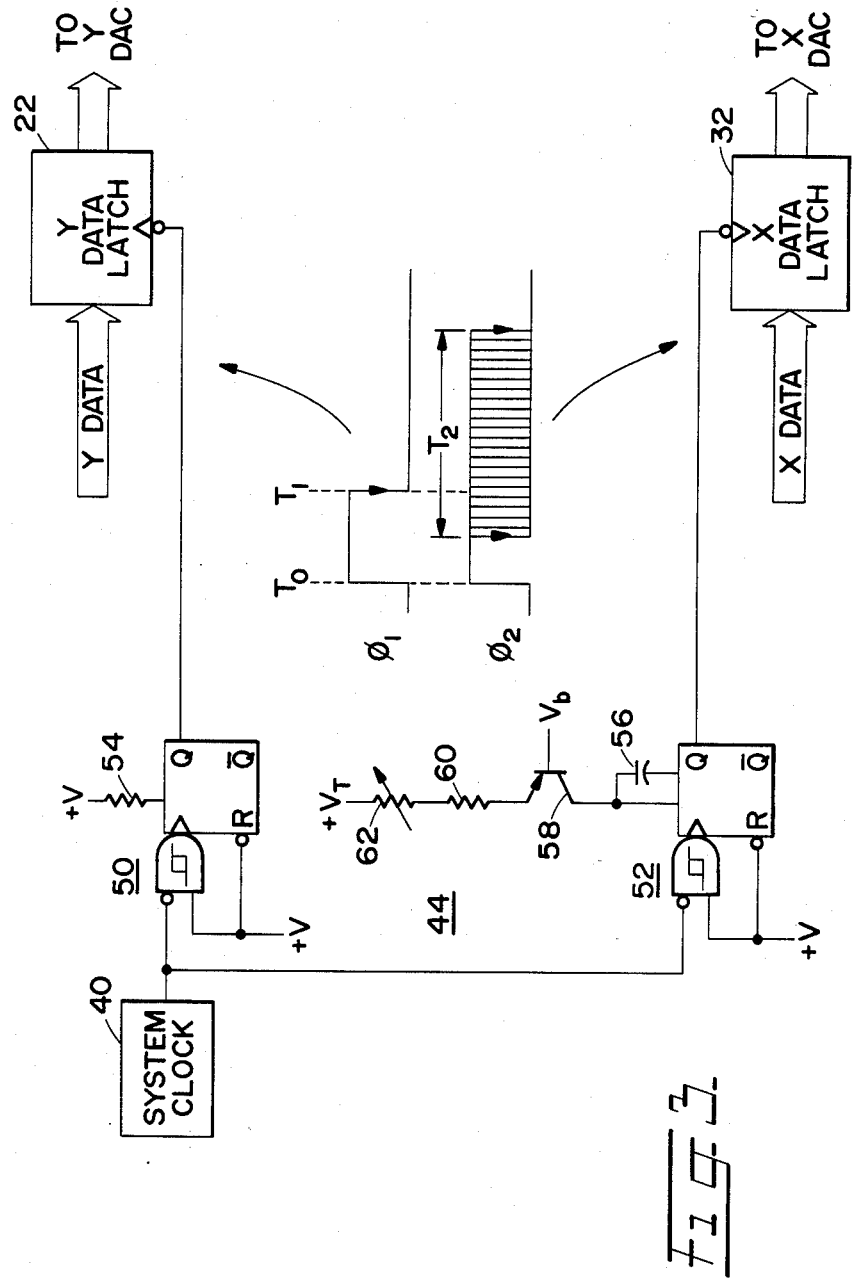

DELAY COMPENSATION METHOD AND APPARATUS FOR DIGITAL DISPLAY SYSTEMS

BACKGROUND OF THE INVENTION

In displaying reconstructed digital data from, for example, a waveform memory, digital data is converted to analog representations of the instantaneous values of signal amplitude at discrete time points at some display clock rate. Often, filters or vector generators are used to interpolate between and connect the analog values, or so-called data points. This may be true for either X (horizontal) versus Y (vertical) display systems or Y (amplitude) versus T (time) display systems. In order that linear vectors be produced so that a straight line is drawn between data points on a display device, such as a cathode-ray tube or a graphics plotter, the horizontal and vertical deflection generators must receive the respective horizontal and vertical drive signals simultaneously. That is, any timing mismatch between the horizontal and vertical drive signals at the deflection generators will produce bent vectors, the degree of non-linearity depending upon the amount of time mismatch.

Time mismatch may be caused by various delay-producing mechanisms in the horizontal and vertical signal-processing paths, and may include conventional oscilloscope delay line behavior, as well as propagation delays, differences in signal path lengths, and even delays due to component variations in the digital-to-analog signal reconstruction circuits or in the display system. Of course, the effects of such delays become more apparent and pronounced as the speed at which such data points are displayed is increased because even the slightest time mismatch will result in non-linear vectors.

SUMMARY OF THE INVENTION

In accordance with the present invention, a delay compensation method and apparatus provides a precise time match between reconstructed horizontal and vertical signals arriving at the deflection generators of a display device so that straight vectors can be drawn between displayed data points. Digital data flowing in the horizontal and vertical signal-processing channels, respectively, is shifted in time with respect to each other by an amount equal to the difference in delay times between the respective channels. This is achieved by clocking the channels differentially at the same clock rate. A differential clock generator produces first and second related clock signals, the second of which is selectably variable in time to occur either before or after the first by the amount necessary to compensate the delay time. The first and second clock signals are applied to latch devices in the respective channels to control the timing of the digital data passing therethrough, thereby controlling the rate and timing at which digital data words are presented to digital-to-analog converters to be converted to deflection signals.

The present invention is suitable for use in high-speed systems such as digital oscilloscopes or X-Y monitors, as well as low-speed systems such as X-Y plotters or other hard copy media.

It is therefore one object and feature of the present invention to provide a delay compensation method and apparatus for digital display systems to provide a time match of signals arriving at a display-producing medium via separate signal paths.

It is another feature of the present invention to provide a time match of analog signals in separate signal channels by adjusting the timing of progenitor digital signals before conversion to analog form to compensate for delays in the respective signal channels.

It is an additional feature of the present invention to provide a time skew or displacement of digital signals using a differential clock generator.

Other objects, features, and advantages of the present invention will become obvious to those having ordinary skill in the art upon a reading of the following description when taken in conjunction with the drawings.

DRAWINGS

FIG. 1 shows the timing relationship of deflection signals in an X-Y display system;

FIG. 2 is a block diagram of a digital-to-analog display system employing a differential clock generator in accordance with the present invention; and FIG. 3 is a schematic showing the details of the differential clock generator of FIG. 2.

DETAILED DESCRIPTION OF THE INVENTION

Referring now to the drawings, there is shown in FIG. 1 an X-Y display system 10 having a graphics display medium 12 upon which an image may be produced. To understand the timing relationship of the X versus Y deflection signals, let us suppose that the display is to consist of a straight line 14 drawn between a point A and a point B on the display medium 12. The X and Y deflection signals, then, should be linear ramps which both start at a time $T_S$ and finish at a time $T_F$. These signals are shown as being applied to the Y input and X input, respectively, of the display system 10. However, any delay time $T_D$ in either of the signal paths, such as that represented by block 16 in the Y input signal path, causes a time shift of the Y deflection signal in this case, as shown by the dashed line between shifted start and stop times $T_S'$ and $T_F'$. This in turn causes a bowing of the line drawn between points A and B on the display medium 12, represented by the dashed line 18. Of course, the amount of bowing, or degree of non-linearity, depends upon the time shift $T_D$ between the two deflection signals.

In FIG. 2, there is shown a Y data and signal processing channel comprising a data memory 20, a data latch 22, a digital-to-analog converter (DAC) 24, and a vector generator 26. Similarly, an X data and signal processing channel comprises a data memory 30, a data latch 32, a DAC 34, and a vector generator 36. A system clock 40 produces clock signals to drive an address generator 42, which in turn generates addresses to access memory locations in the data memories 20 and 30. As each memory location of data memories 20 and 30 is addressed, the data stored therein, which may suitably be in the form of an n-bit data word, is read out and presented to a respective data latch 22 and 32. The system clock signals from system clock 40 are also applied to a differential clock generator 44, which produces two clock signals $\phi_1$ and $\phi_2$ at the same clock rate as the system clock, but the active edges of which occur at different times with respect to the active edge of the system clock signal. In the embodiment built and tested, the first clock signal $\phi_1$, that is, the active edge thereof, occurs a fixed time delay following the system clock edge, and the second clock signal $\phi_2$ is selectably variable in time to occur before or after clock signal $\phi_1$ by the amount necessary to compensate the delay time in the system. The first and second clock signals $\phi_1$ and $\phi_2$ are applied to latches 22 and 32, respectively, to control the timing of the data words being latched thereby by synchronizing such respective data words to the first and second clock signals, respectively, and thus controlling the rate and timing at which the data words are presented to DACs 24 and 34. Of course, the DACs convert the digital data words to analog values, and then the vector generators 26 and 36 smooth the Y and X signals by interpolating between the discrete analog levels produced by the DACs. The vector generators 26 and 36 may suitably be commercially-available vector generators, or they may be filters fabricated of discrete capacitors and resistors. The Y and X signals are applied as deflection signals to the display system 10.

Referring back to FIG. 1 at this point, it is to be emphasized that the desired time match between the Y and X deflection signals is achieved by adjusting the timing of clock signal $\phi_2$ with respect to clock signal $\phi_1$ to skew the timing of the digital data words being strobed into latches 22 and 32 by the amount necessary to compensate for any delays in the system. Since the time match is carried out while the data is still in digital form and before it is applied to a display system, comparatively inexpensive systems employing lower tolerance components may be accurately compensated. Furthermore, the display system 10 may be any graphic display system, including oscilloscopes and X-Y plotters. Additionally, it should be pointed out that in an amplitude versus time system, such as an oscilloscope, the address signals from address generator 42 are typically a progressive count signal which is converted by DAC 34 and vector generator 36 to a linear sawtooth to drive the time axis of the display, so that in such a case the X memory 30 would be superfluous and could therefore be omitted.

The details of the differential clock generator 44 are shown in FIG. 3. Basically, the circuit comprises a pair of logic circuits such as multivibrators 50 and 52, which are shown as AND-gate and flip-flop combinations to represent monostable multivibrators with Schmitt-trigger inputs in accordance with commercially-available 74LS221 data sheets. Both multivibrators 50 and 52 are triggered on the negative edge of the system clock signal from system clock 40, causing the Q outputs thereof to go high at time $T_0$. Once triggered, the Q outputs are independent of further system clock transitions, and the negative transitions of the Q outputs are a function of the timing components. For multivibrator 50, the Q output goes low at time $T_1$ determined by resistor 54. At time $T_1$, the negative edge of clock signal $\phi_1$ is applied to latch 22, latching Y data therein. The timing of the negative edge of clock signal $\phi_2$ is determined by capacitor 56 and current-source transistor 58, and thus the time $T_2$ at which clock signal $\phi_2$ goes low is adjustable over a continuously variable range. A resistor 60 sets the maximum current through transistor 58, and hence the minimum time between $T_0$ and $T_2$, and a variable resistor 62 provides the variable range. At time $T_2$, the negative edge of clock signal $\phi_2$ is applied to latch 32, latching X data therein. As can be seen, the time $T_2$ may be adjusted to occur before, contemporaneously with, or after time $T_1$ thereby to provide whatever delay compensation a given system requires.

Although the present invention has been described in connection with a particular embodiment thereof, it is to be understood that additional embodiments, modifications, and applications thereof which will be obvious to those skilled in the art are included within the spirit and scope of the invention.

What I claim is:

1. A method of compensating timing errors between signals in separate signal paths, comprising:
   generating digital data at a predetermined rate for a first signal path and a second signal path;
   generating a differential clock signal in synchronism with said data, said differential clock signal comprising a first clock signal and a second clock signal wherein the time occurrence of the second clock signal is selectably variable with respect to the first clock signal; and
   synchronizing the time occurrence of data in said first signal path with said first clock signal, and synchronizing the data in said second signal path with said second clock signal.

2. A method in accordance with claim 1 further comprising the steps of:
   converting said digital data to analog signals;
   driving a display device with said analog signals such that an undistorted display indicates a time match between such signals and a distorted display indicates a time mismatch between such signals; and
   varying the time occurrence of said second clock signal to provide an undistorted display.

3. An apparatus for compensating timing errors between signals in separate signal paths, comprising:
   means for generating digital data at a predetermined rate for a first signal path and a second signal path;
   means for generating a differential clock signal in synchronism with said data, said differential clock signal comprising a first clock signal and a second clock signal wherein the time occurrence of the second clock signal is selectably variable in time with respect to the first clock signal; and
   means for synchronizing the time occurrence of data in said first signal path with said first clock signal and data in said second signal path with said second clock signal.

4. An apparatus in accordance with claim 3 wherein said digital data generating means includes memory means for storing at least a portion of said digital data, and means for addressing said memory means at said predetermined rate.

5. An apparatus in accordance with claim 4 wherein said addressing means comprises a source of clock signals and an address generator responsive to said clock signals.

6. An apparatus in accordance with claim 3 wherein sad differential clock signal generating means comprises a source of system clock signals, and first and second logic circuits responsive to said system clock signals for producing said first and second clock signals, respectively.

7. An apparatus in accordance with claim 6 wherein said first and second logic circuits comprise first and second multivibrators.

8. An apparatus in accordance with claim 6 wherein said differential clock signal generating means further comprises means for adjusting the time delay for activation of at least one of said first and second logic circuits.

9. An apparatus in accordance with claim 3 wherein said synchronizing means comprises first latch means for latching data in said first signal path and second latch means for latching data in said second signal path.

10. An apparatus in accordance with claim 3 further comprising means for converting said digital data to analog signals; means for displaying said analog signals wherein an undistorted display indicates a time match of such signals and a distorted display indicates a time mismatch thereof; and means for varying the time occurrence of one of said first and second clock signals.

* * * * *